(12) United States Patent
Kidoh et al.

(10) Patent No.: US 8,890,235 B2
(45) Date of Patent: *Nov. 18, 2014

(54) NONVOLATILE SEMICONDUCTOR MEMORY DEVICE AND METHOD FOR MANUFACTURING SAME

(71) Applicant: Kabushiki Kaisha Toshiba, Minato-ku (JP)

(72) Inventors: Masaru Kidoh, Tokyo (JP); Yoshiaki Fukuzumi, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/036,896

(22) Filed: Sep. 25, 2013

(65) Prior Publication Data

US 2014/0021531 A1    Jan. 23, 2014

Related U.S. Application Data

(63) Continuation of application No. 12/883,757, filed on Sep. 16, 2010, now Pat. No. 8,569,826.

(30) Foreign Application Priority Data

Jun. 21, 2010  (JP) ................................. 2010-140232

(51) Int. Cl.
*H01L 29/792* (2006.01)
*H01L 27/115* (2006.01)
*H01L 29/66* (2006.01)

(52) U.S. Cl.
CPC .......... *H01L 29/792* (2013.01); *H01L 29/7926* (2013.01); *H01L 27/11582* (2013.01); *H01L 27/11573* (2013.01); *H01L 29/66833* (2013.01); *H01L 27/11578* (2013.01)
USPC ............. 257/326; 257/E29.309; 257/E27.026

(58) Field of Classification Search
USPC ................... 257/324, 326, E29.309, E27.026
See application file for complete search history.

(56) References Cited

U.S. PATENT DOCUMENTS 6,727,544 B2   4/2004   Endoh et al.
6,870,215 B2   3/2005   Endoh et al.
(Continued)

FOREIGN PATENT DOCUMENTS

JP    2007-317874 A    12/2007
JP    2008-171839 A    7/2008
(Continued)

OTHER PUBLICATIONS

Office Action issued Nov. 21, 2013 in Japanese Patent Application No. 2010-140232 (with English language translation).

*Primary Examiner* — Matthew E Warren
(74) *Attorney, Agent, or Firm* — Oblon, Spivak, McClelland, Maier & Neustadt, L.L.P.

(57) ABSTRACT

According to one embodiment, a nonvolatile semiconductor memory device includes a stacked structure, a select gate electrode, a semiconductor pillar, a memory layer, and a select gate insulating film. The stacked structure includes a plurality of electrode films stacked in a first direction and an interelectrode insulating film provided between the electrode films. The select gate electrode is stacked with the stacked structure along the first direction and includes a plurality of select gate conductive films stacked in the first direction and an inter-select gate conductive film insulating film provided between the select gate conductive films. The semiconductor pillar pierces the stacked structure and the select gate electrode in the first direction. The memory layer is provided between the electrode films and the semiconductor pillar. The select gate insulating film is provided between the select gate conductive films and the semiconductor pillar.

23 Claims, 8 Drawing Sheets

(56) References Cited

U.S. PATENT DOCUMENTS

| | | |
|---|---|---|
| 8,178,919 B2 | 5/2012 | Fujiwara et al. |
| 8,198,670 B2 | 6/2012 | Aoyama |
| 8,350,326 B2 | 1/2013 | Fukuzumi et al. |
| 8,569,826 B2 * | 10/2013 | Kidoh et al. ............. 257/324 |
| 2007/0252201 A1 | 11/2007 | Kito et al. |
| 2008/0180994 A1 | 7/2008 | Katsumata et al. |
| 2008/0186771 A1 | 8/2008 | Katsumata et al. |
| 2009/0212350 A1 * | 8/2009 | Kidoh et al. ............. 257/324 |
| 2010/0207195 A1 | 8/2010 | Fukuzumi et al. |

FOREIGN PATENT DOCUMENTS

| | | |
|---|---|---|
| JP | 2008-192708 A | 8/2008 |
| JP | 2009-146954 | 7/2009 |
| JP | 2010-67582 | 3/2010 |
| WO | WO 2009/075370 A1 | 6/2009 |

* cited by examiner

NONVOLATILE SEMICONDUCTOR MEMORY DEVICE AND METHOD FOR MANUFACTURING SAME

CROSS-REFERENCE TO RELATED APPLICATIONS

This application is a continuation of and claims the benefit of priority under 35 U.S.C. §120 from U.S. Ser. No. 12/883,757, filed Sep. 16, 2010 and claims the benefit of priority from the prior Japanese Patent Application No. 2010-140232, filed on Jun. 21, 2010; the entire contents of which are incorporated herein by reference.

FIELD

Embodiments described herein relate generally to a nonvolatile semiconductor memory device and a method for manufacturing the same.

BACKGROUND

In conventional nonvolatile semiconductor memory devices, device elements are integrated in a two-dimensional plane on a silicon substrate. Increasing its memory capacity requires miniaturization of the dimensions of each single element. However, such miniaturization has recently been difficult in terms of cost and technology.

In this context, a collectively processed three-dimensional stacked memory has been proposed. This collectively processed three-dimensional stacked memory includes a stacked structure with insulating films and electrode films alternately stacked therein, silicon pillars piercing the stacked structure, and a charge storage layer (memory layer) provided between the silicon pillar and the electrode film. Thus, a memory cell is formed at the intersection between the silicon pillar and each electrode film. Furthermore, it is also proposed to use a U-shaped memory string connecting two silicon pillars on the substrate side. In such a collectively processed three-dimensional stacked memory, there is room for improvement to further increase the productivity.

DETAILED DESCRIPTION

Figure 1:
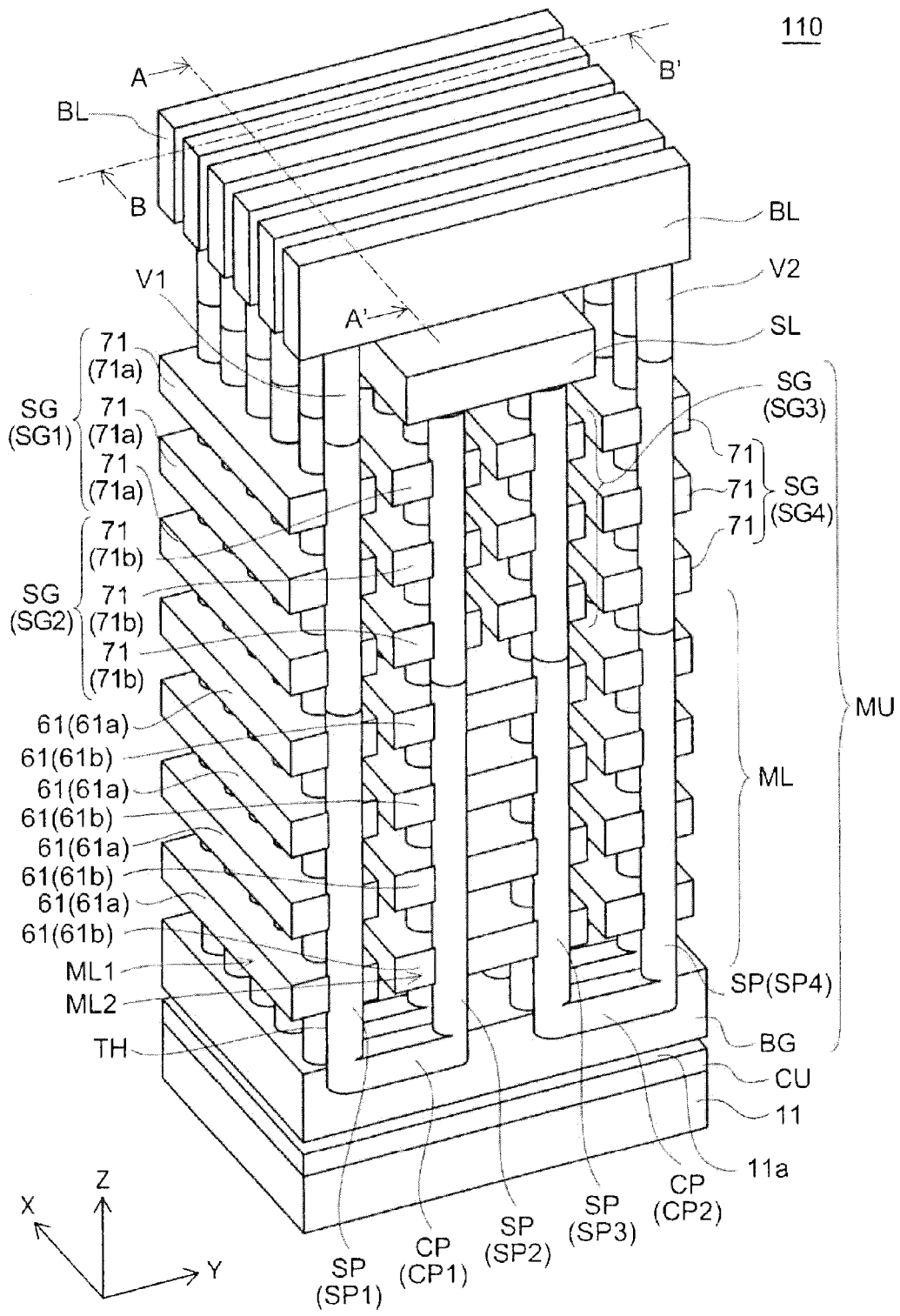
FIG. 1 is a schematic perspective view illustrating the configuration of a nonvolatile semiconductor memory device according to a first embodiment.

In general, according to one embodiment, a nonvolatile semiconductor memory device includes a first stacked structure, a first select gate electrode, a first semiconductor pillar, a first memory layer, a first inner insulating film, a first outer insulating film and a first select gate insulating film. The first stacked structure includes a plurality of first electrode films stacked in a first direction and a first interelectrode insulating film provided between the plurality of first electrode films. The first select gate electrode is stacked with the first stacked structure along the first direction and includes a plurality of first select gate conductive films stacked in the first direction and a first inter-select gate conductive film insulating film provided between the plurality of first select gate conductive films. The first semiconductor pillar pierces the first stacked structure and the first select gate electrode in the first direction. The first memory layer is provided between the plurality of first electrode films and the first semiconductor pillar. The first inner insulating film is provided between the first memory layer and the first semiconductor pillar. The first outer insulating film is provided between the first memory layer and the plurality of first electrode films, and the first select gate insulating film is provided between the plurality of first select gate conductive films and the first semiconductor pillar.

According to another embodiment, a method for manufacturing a nonvolatile semiconductor memory device is disclosed. The device includes a stacked; a select gate; a semiconductor; a memory; an inner insulating; an outer insulating; and a select gate insulating. The stacked structure includes a plurality of electrode films stacked in a first direction and an interelectrode insulating film provided between the plurality of electrode films. The select gate electrode is stacked with the stacked structure in the first direction. The select gate electrode includes a plurality of select gate conductive films stacked in the first direction and an inter-select gate conductive film insulating film provided between the plurality of select gate conductive films. The semiconductor pillar pierces the stacked structure and the select gate electrode in the first direction. The memory layer is provided between the plurality of electrode films and the semiconductor pillar. The inner insulating film is provided between the memory layer and the semiconductor pillar. The outer insulating film is provided between the memory layer and the plurality of electrode films. The select gate insulating film is provided between the plurality of select gate conductive films and the semiconductor pillar. The method can include forming a stacked film preform on a substrate. The stacked film preform includes a stacked film including a conductive film serving as the electrode film and an insulating film serving as the interelectrode insulating film, and a stacked film including a conductive film serving as the select gate conductive film and an insulating film serving as the inter-select gate conductive film insulating film. The method can include forming a mask material having a predetermined pattern configuration on the stacked film perform. In addition, the method can include processing the stacked film preform by repeating etching of the stacked film preform using the mask material as a mask and slimming of the mask material.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, the same components as those described previously with reference to earlier figures are labeled with like reference numerals, and the detailed description thereof is omitted as appropriate.

First Embodiment

FIG. 1 is a schematic perspective view illustrating the configuration of a nonvolatile semiconductor memory device according to a first embodiment.

In FIG. 1, for clarity of illustration, only the conductive portions are shown, and illustration of the insulating portions is omitted.

Figure 2:
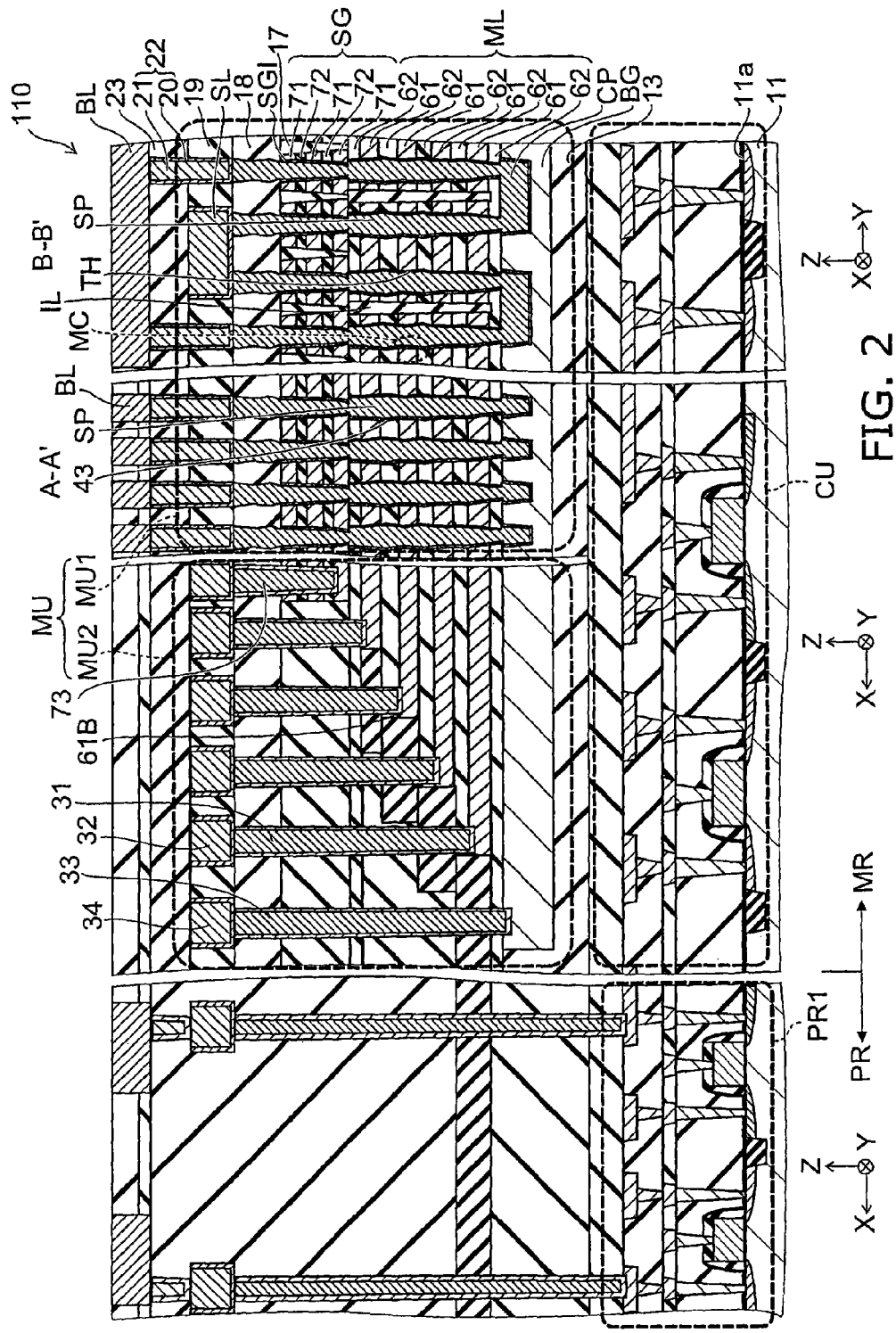
FIG. 2 is a schematic cross-sectional view illustrating the configuration of the nonvolatile semiconductor memory device according to the first embodiment.

FIG. 2 is a schematic cross-sectional view illustrating the configuration (overall configuration) of the nonvolatile semiconductor memory device according to the first embodiment.

Figure 3:
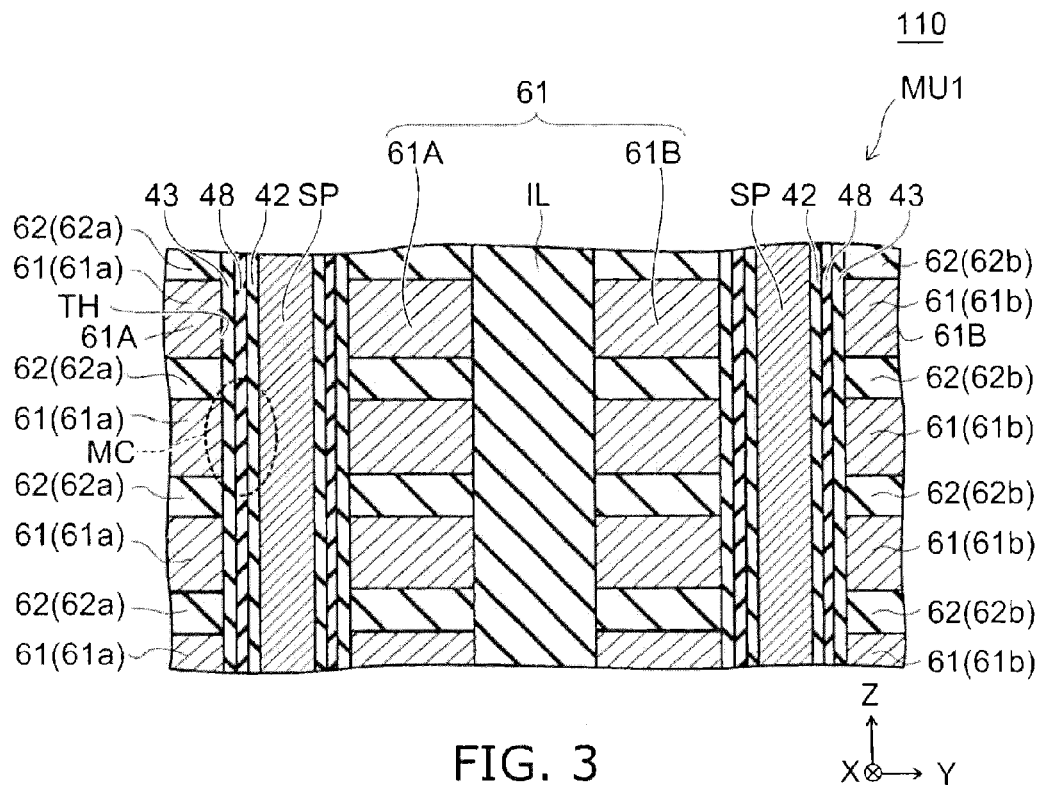
FIG. 3 is a schematic cross-sectional view illustrating the configuration of part of the nonvolatile semiconductor memory device according to the first embodiment.

FIG. 3 is a schematic cross-sectional view illustrating the configuration of part of the nonvolatile semiconductor memory device according to the first embodiment.

Figure 4:
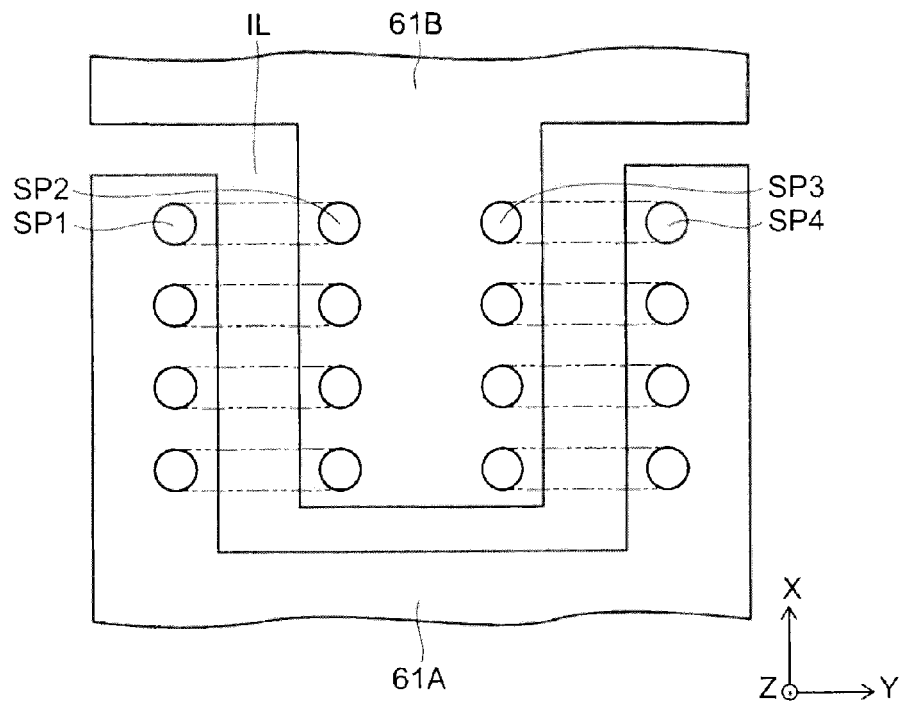
FIG. 4 is a schematic plan view illustrating the configuration of part of the nonvolatile semiconductor memory device according to the first embodiment.

FIG. 4 is a schematic plan view illustrating the configuration of part (electrode film) of the nonvolatile semiconductor memory device according to the first embodiment.

The nonvolatile semiconductor memory device 110 according to this embodiment is a three-dimensional stacked flash memory.

As shown in FIGS. 1 and 2, the nonvolatile semiconductor memory device 110 includes a semiconductor substrate 11 illustratively made of single crystal silicon.

In this example, on the semiconductor substrate 11, a memory array region MR to be provided with memory cells and a peripheral region PR provided e.g. around the memory array region MR are defined. In the peripheral region PR, various peripheral region circuits PR1 are provided on the semiconductor substrate 11.

In the memory array region MR, a circuit unit CU, for instance, is provided on the semiconductor substrate 11, and a memory unit MU is provided on the circuit unit CU. The circuit unit CU is provided as needed, and can be omitted. An interlayer insulating film 13 illustratively made of silicon oxide is provided between the circuit unit CU and the memory unit MU.

The memory unit MU illustratively includes a matrix memory cell unit MU1 including memory cell transistors arranged in a three-dimensional matrix, and an interconnection connecting unit MU2 for connecting interconnections in the matrix memory cell unit MU1.

FIG. 1 illustrates the configuration of the matrix memory cell unit MU1.

With regard to the matrix memory cell unit MU1, FIG. 2 illustrates part of its A-A' cross section in FIG. 1 and part of its B-B' cross section in FIG. 1.

As shown in FIGS. 1 and 2, in the matrix memory cell unit MU1, a stacked structure ML and a select gate electrode SG stacked with the stacked structure ML are provided on the major surface 11a of the semiconductor substrate 11. The term "stacked" used herein refers not only to being directly stacked, but also to being stacked with other components inserted in midstream.

The stacking direction of the stacked structure ML and the select gate electrode SG is defined as Z-axis direction (first direction). In this example, the Z-axis direction is perpendicular to the major surface 11a of the semiconductor substrate 11. One of the directions perpendicular to the Z-axis direction is defined as Y-axis direction (second direction). Furthermore, the direction perpendicular to the Z-axis direction and the Y-axis direction is defined as X-axis direction (third direction).

The stacked structure ML includes a plurality of electrode films 61 stacked in the Z-axis direction, and an interelectrode insulating film 62 provided between the plurality of electrode films 61. The interelectrode insulating film 62 functions as an interlayer insulating film for insulating the electrode films 61 from each other.

The select gate electrode SG is stacked with the stacked structure ML along the Z-axis direction. The select gate electrode SG includes a plurality of select gate conductive films 71 stacked in the Z-axis direction, and an inter-select gate conductive film insulating film 72 provided between the plurality of select gate conductive films 71. The inter-select gate conductive film insulating film 72 functions as an interlayer insulating film for insulating the select gate conductive films 71 from each other.

In this example, the electrode film 61 includes a strip-shaped portion extending along the X-axis direction. The select gate conductive film 71 also includes a strip-shaped portion extending along the X-axis direction.

Furthermore, a semiconductor pillar SP is provided. The semiconductor pillar SP pierces the stacked structure ML and the select gate electrode SG in the Z-axis direction. This semiconductor pillar SP is formed by e.g. burying a semiconductor in a through hole TH piercing the stacked structure ML in the Z-axis direction.

FIG. 3 illustrates the configuration of the matrix memory cell unit MU1. For instance, FIG. 3 is a cross-sectional view corresponding to part of the B-B' cross section in FIG. 1.

As shown in FIG. 3, the nonvolatile semiconductor memory device 110 includes the aforementioned semiconductor pillar SP, a memory layer 48, an inner insulating film 42, and an outer insulating film 43.

The memory layer 48 is provided between each electrode film 61 and the semiconductor pillar SP.

The inner insulating film 42 is provided between the memory layer 48 and the semiconductor pillar SP. The inner insulating film 42 functions as a tunnel insulating film.

The outer insulating film 43 is provided between the memory layer 48 and the electrode film 61. The outer insulating film 43 functions as a block insulating film.

The electrode film 61 is applied with a prescribed electrical signal and can function as a word line of the nonvolatile semiconductor memory device 110.

The electrode film 61 and the select gate conductive film 71 can be made of any conductive material, such as amorphous silicon (noncrystalline silicon) endowed with conductivity by impurity doping, or polysilicon (polycrystalline silicon) endowed with conductivity by impurity doping, or metals and alloys.

The interelectrode insulating film 62, the inner insulating film 42, the outer insulating film 43, and the inter-select gate conductive film insulating film 72 can be made of e.g. silicon oxide.

The memory layer 48 can be made of e.g. silicon nitride. The memory layer 48 functions as a portion for storing information by storing or releasing charge under an electric field applied between the semiconductor pillar SP and the electrode film 61. The memory layer 48 may be either a single layer film or a stacked film.

As described later, the interelectrode insulating film 62, the inner insulating film 42, the outer insulating film 43, the inter-select gate conductive film insulating film 72, and the memory layer 48 are not limited to the materials illustrated above, but can be made of various materials.

Thus, in the nonvolatile semiconductor memory device 110, a memory cell transistor including the memory layer 48 is formed at the intersection between the electrode film 61 and the semiconductor pillar SP. The memory cell transistors are arranged in a three-dimensional matrix. Each memory cell transistor functions as a memory cell MC for storing data by storing charge in the memory layer 48.

As shown in FIG. 2, in the nonvolatile semiconductor memory device 110, a select gate insulating film SGI is provided between the select gate conductive film 71 and the semiconductor pillar SP.

The select gate insulating film SGI may be the aforementioned stacked film of the inner insulating film 42, the memory layer 48, and the outer insulating film 43. Alternatively, the select gate insulating film SGI may be an insulating film different from the stacked film of the inner insulating film 42, the memory layer 48, and the outer insulating film 43. The select gate insulating film SGI may be either a single layer film or a stacked film.

A select gate transistor is formed at the intersection between the select gate electrode SG and the semiconductor pillar SP. The select gate insulating film SGI functions as a gate insulating film of this select gate transistor. The select gate transistor has a function of selecting the semiconductor pillar SP.

In FIGS. 1 and 2, four electrode films 61 are depicted. However, the number of electrode films 61 provided in the stacked structure ML is arbitrary. Furthermore, in FIGS. 1 and 2, three select gate conductive films 71 are depicted. However, the number of select gate conductive films 71 provided in the select gate electrode SG is arbitrary.

In the semiconductor pillar SP, the portion piercing the stacked structure ML may be a semiconductor layer formed continuously with the portion piercing the select gate electrode SG. Alternatively, the portion of the semiconductor pillar SP piercing the stacked structure ML and the portion of the semiconductor pillar SP piercing the select gate electrode SG may be formed in different process steps and then electrically connected.

The semiconductor pillar SP may be shaped like a solid cylinder extending in the Z-axis direction, or a hollow cylinder extending in the Z-axis direction. In the case where the semiconductor pillar SP is shaped like a hollow cylinder extending in the Z-axis direction, an insulating film, for instance, can be buried inside the hollow cylinder.

As shown in FIG. 2, an insulating film is provided below the lowermost electrode film 61 (e.g., the electrode film 61 nearest to the semiconductor substrate 11) of the stacked structure ML. In this example, for convenience, this insulating film is also referred to as interelectrode insulating film 62. Furthermore, an insulating film is provided above the uppermost electrode film 61 (e.g., the electrode film 61 farthest from the semiconductor substrate 11) of the stacked structure ML. In this example, for convenience, this insulating film is also referred to as interelectrode insulating film 62.

Here, an insulating film can be provided above the uppermost select gate conductive film 71. This insulating film may also be regarded as an inter-select gate conductive film insulating film 72 for convenience. Furthermore, an insulating film can be provided below the lowermost select gate conductive film 71. This insulating film may also be regarded as an inter-select gate conductive film insulating film 72 for convenience.

As shown in FIG. 2, an interlayer insulating film 17 is provided to divide the select gate electrodes SG along the Y-axis direction. The interlayer insulating film 17 extends along the X-axis direction.

An interlayer insulating film 18 is provided on the interlayer insulating film 17. A source line SL (second interconnection) and a via 22 are provided on the interlayer insulating film 18. An interlayer insulating film 19 is provided around the source line SL. The via 22 illustratively includes a stacked film of a barrier layer 20 and a metal layer 21.

An interlayer insulating film 23 is provided on the source line SL. A bit line BL (first interconnection) is provided on the interlayer insulating film 23. The bit line BL is shaped like e.g. a strip along the Y axis. The interlayer insulating films 17, 18, 19, and 23 can be made of e.g. silicon oxide.

In this example, every two semiconductor pillars SP are connected on the semiconductor substrate 11 side.

More specifically, the nonvolatile semiconductor memory device 110 further includes a semiconductor connecting portion CP (first semiconductor connecting portion CP1) electrically connecting a first semiconductor pillar SP1 and a second semiconductor pillar SP2 on the semiconductor substrate 11 side. The semiconductor connecting portion CP can be made of the material constituting the semiconductor pillar SP. The semiconductor connecting portion CP is opposed to a back gate BG (connecting portion conductive layer).

However, the embodiment is not limited thereto. As described later, each semiconductor pillar SP may be independent and may not be connected by the semiconductor connecting portion CP on the semiconductor substrate 11 side. In the following description, as illustrated in FIGS. 2 and 3, it is assumed that two semiconductor pillars SP are connected by the semiconductor connecting portion CP.

Here, the nonvolatile semiconductor memory device 110 includes a plurality of semiconductor pillars. When all or any of the semiconductor pillars are referred to, the term "semiconductor pillar SP" is used. On the other hand, when a particular semiconductor pillar is referred to in describing the relationship between particular semiconductor pillars, for instance, the term "n-th semiconductor pillar SPn" (n is any integer of one or more) is used. This also applies to other components. For instance, when all or any of the semiconductor connecting portions are referred to, the term "semiconductor connecting portion CP" is used. On the other hand, when a particular semiconductor connecting portion is referred to, the term "n-th semiconductor connecting portion CPn" (n is any integer of one or more) is used.

As shown in FIG. 1, the first and second semiconductor pillar SP1 and SP2 connected by the first semiconductor connecting portion CP1 are paired into one U-shaped NAND string. The third and fourth semiconductor pillar SP3 and SP4 connected by the second semiconductor connecting portion CP2 are paired into another U-shaped NAND string.

As shown in FIG. 4, for instance, among the electrode films 61, the electrode films corresponding to the semiconductor pillars SP(4m+1) and SP(4m+4) with the aforementioned integer n being equal to 4m+1 and 4m+4 are commonly connected to form an electrode film 61A. The electrode films corresponding to the semiconductor pillars SP(4m+2) and SP(4m+3) with n being equal to 4m+2 and 4m+3 are commonly connected to form an electrode film 61B. Here, m is an integer of zero or more. That is, the electrode films 61 are shaped into the electrode film 61A and the electrode film 61B opposed in the X-axis direction and meshed with each other like comb teeth.

As shown in FIG. 3, the electrode film 61A and the electrode film 61B are divided from each other by an insulating layer IL.

As in the interconnection connecting unit MU2 illustrated in FIG. 2, at one end in the X-axis direction, the electrode film 61B is connected to a word interconnection 32 by a via plug 31, and electrically connected to e.g. a driving circuit provided on the semiconductor substrate 11. Similarly, at the other end in the X-axis direction, the electrode film 61A is connected to a word interconnection by a via plug, and electrically connected to a driving circuit (not shown in FIG. 2). That is, the length in the X-axis direction of the electrode films 61 (electrode films 61A and electrode films 61B) stacked in the Z-axis direction is varied in a staircase pattern. Thus, the electrode film 61A is electrically connected to a driving circuit at one end in the X-axis direction, and the electrode film 61B is electrically connected to a driving circuit at the other end in the X-axis direction. In FIG. 2, the via plug 31 is connected to each electrode film 61 at the same position in the Y-axis direction. However, the position of the via plug 31 for each electrode film 61 can be varied in the Y-axis direction.

Thus, in the electrode films 61 equidistant from the semiconductor substrate 11, the first semiconductor pillar SP1 and the second semiconductor pillar SP2 constituting a pair can be placed at different potentials. Thus, the memory cells MC in the same layer corresponding to the first semiconductor pillar SP1 and the second semiconductor pillar SP2 can be operated independently of each other. This also applies to the third semiconductor pillar SP3 and the fourth semiconductor pillar SP4.

The combination of the electrode film 61A and the electrode film 61B can constitute one erasure block. Thus, a set of the electrode film 61A and the electrode film 61B is divided from another set of the electrode film 61A and the electrode film 61B in units of erasure blocks.

Here, the number of semiconductor pillars in the X-axis and Y-axis direction included in each erasure block is arbitrary.

The back gate BG is connected to a back gate interconnection 34 by a via plug 33.

As shown in FIGS. 1 and 2, each end of the semiconductor pillar SP opposite to the semiconductor connecting portion CP is connected to the bit line BL or the source line SL. Each semiconductor pillar SP is provided with the select gate electrode SG (first to fourth select gate electrode SG1-SG4). Thus, desired data can be written to and read from an arbitrary memory cell MC of an arbitrary semiconductor pillar SP.

As described above, the nonvolatile semiconductor memory device 110 comprises a first stacked structure ML1, a first select gate electrode SG1, a first semiconductor pillar SP1, a first memory layer (memory layer 48), a first inner insulating film (inner insulating film 42), a first outer insulating film (outer insulating film 43), and a first select gate insulating film (select gate insulating film SGI).

The first stacked structure ML1 includes a plurality of first electrode films 61a stacked in the Z-axis direction, and a first interelectrode insulating film 62a provided between the plurality of first electrode films 61a.

The first select gate electrode SG1 is stacked with the first stacked structure ML1 along the Z-axis direction. The first select gate electrode SG1 includes a plurality of first select gate conductive films 71a stacked in the Z-axis direction and a first inter-select gate conductive film insulating film 72a provided between the plurality of first select gate conductive films 71a.

The first semiconductor pillar SP1 pierces the first stacked structure ML1 and the first select gate electrode SG1 in the Z-axis direction.

The first memory layer is provided between the plurality of first electrode films 61a and the first semiconductor pillar SP1. The first inner insulating film is provided between the first memory layer and the first semiconductor pillar SP1. The first outer insulating film is provided between the first memory layer and the plurality of first electrode films 61a. The first select gate insulating film is provided between the plurality of first select gate conductive films 71a and the first semiconductor pillar SP1.

The nonvolatile semiconductor memory device 110 further includes a second stacked structure ML2, a second select gate electrode SG2, a second semiconductor pillar SP2, a second memory layer (memory layer 48), a second inner insulating film (inner insulating film 42), a second outer insulating film (outer insulating film 43), a second select gate insulating film (select gate insulating film SGI), and a first semiconductor connecting portion CP1 (semiconductor connecting portion CP).

The second stacked structure ML2 is adjacent to the first stacked structure ML1 in the Y-axis direction perpendicular to the Z-axis direction. The second stacked structure ML2 includes a plurality of second electrode films 61b stacked in the Z-axis direction, and a second interelectrode insulating film 62b provided between the plurality of second electrode films 61b.

The second select gate electrode SG2 is stacked with the second stacked structure ML2 along the Z-axis direction. The second select gate electrode SG2 includes a plurality of second select gate conductive films 71b stacked in the Z-axis direction and a second inter-select gate conductive film insulating film 72b provided between the plurality of second select gate conductive films 71b.

For instance, the thickness of each of the plurality of second select gate conductive films 71b is equal to the thickness of each of the plurality of first select gate conductive films 71a. The thickness of each of the plurality of second inter-select gate conductive film insulating films 72b is equal to the thickness of each of the plurality of first inter-select gate conductive film insulating films 72a. That is, the second select gate conductive film 71b is in the same layer as the first select gate conductive film 71a. Thus, the second select gate conductive film 71b and the first select gate conductive film 71a can be collectively obtained by the same film formation process. The second inter-select gate conductive film insulating film 72b is in the same layer as the first inter-select gate conductive film insulating film 72a. Thus, the second inter-select gate conductive film insulating film 72b and the first inter-select gate conductive film insulating film 72a can be collectively obtained by the same film formation process.

The second semiconductor pillar SP2 pierces the second stacked structure ML2 and the second select gate electrode SG2 in the Z-axis direction. The second semiconductor pillar SP2 is adjacent to the first semiconductor pillar SP1 along the Y-axis direction.

The second memory layer is provided between the plurality of second electrode films 61b and the second semiconductor pillar SP2. The second inner insulating film is provided between the second memory layer and the second semiconductor pillar SP2. The second outer insulating film is provided between the second memory layer and the plurality of second electrode films 61b. The second select gate insulating film is provided between the plurality of second select gate conductive films 71b and the second semiconductor pillar SP2.

The first semiconductor connecting portion CP1 connects one end of the first semiconductor pillar SP1 and one end of the second semiconductor pillar SP2. The one end of the first semiconductor pillar SP1 and the one end of the second semiconductor pillar SP2 connected by the first semiconductor connecting portion CP1 are the end of the first semiconductor pillar SP1 on the semiconductor substrate 11 side and the end of the second semiconductor pillar SP2 on the semiconductor substrate 11 side.

The nonvolatile semiconductor memory device 110 can further include a first interconnection (e.g., bit line BL) and a second interconnection (e.g., source line SL). The first interconnection is connected to the other end of the first semiconductor pillar SP1 on the opposite side from the first semiconductor connecting portion CP1. The second interconnection is connected to the other end of the second semiconductor pillar SP2 on the opposite side from the first semiconductor connecting portion CP1. The second interconnection extends in a direction orthogonal to the extending direction of the first interconnection. In this example, the first interconnection extends along the Y-axis direction, and the second interconnection extends along the X-axis direction.

As illustrated in FIG. 1, the first semiconductor pillar SP1 is connected to the bit line BL by a via V1, and the fourth semiconductor pillar SP4 is connected to the bit line BL by a via V2.

In the following, the first stacked structure ML1 and the second stacked structure ML2 are generically referred to as stacked structure ML. The first electrode film 61a and the second electrode film 61b are generically referred to as electrode film 61. The first interelectrode insulating film 62a and the second interelectrode insulating film 62b are generically referred to as interelectrode insulating film 62. Furthermore, the first select gate electrode SG1 and the second select gate electrode SG2 are generically referred to as select gate electrode SG. The first select gate conductive film 71a and the second select gate conductive film 71b are generically referred to as select gate conductive film 71. The first inter-select gate conductive film insulating film 72a and the second inter-select gate conductive film insulating film 72b are generically referred to as inter-select gate conductive film insulating film 72.

As described previously, the nonvolatile semiconductor memory device 110 can further include a third semiconductor pillar SP3, a fourth semiconductor pillar SP4, and a second semiconductor connecting portion CP2.

The third semiconductor pillar SP3 is adjacent to the second semiconductor pillar SP2 on the opposite side of the second semiconductor pillar SP2 from the first semiconductor pillar SP1 in the Y-axis direction. The fourth semiconductor pillar SP4 is adjacent to the third semiconductor pillar SP3 on the opposite side of the third semiconductor pillar SP3 from the second semiconductor pillar SP2 in the Y-axis direction.

As described with reference to FIG. 4, in this example, the electrode film 61 pierced by the third semiconductor pillar SP3 is continuous with the second electrode film 61b pierced by the second semiconductor pillar SP2. The electrode film 61 pierced by the fourth semiconductor pillar SP4 is continuous with the first electrode film 61a pierced by the first semiconductor pillar SP1. However, the embodiment is not limited thereto. Each semiconductor pillar SP may pierce a mutually different electrode film 61 (e.g., divided along the Y-axis direction).

The second semiconductor connecting portion CP2 connects one end of the third semiconductor pillar SP3 and one end of the fourth semiconductor pillar SP4. The first interconnection is further connected to the other end of e.g. the fourth semiconductor pillar SP4 on the opposite side from the second semiconductor connecting portion CP2. The second interconnection is further connected to the other end of the third semiconductor pillar SP3 on the opposite side from the second semiconductor connecting portion CP2.

In the nonvolatile semiconductor memory device 110 according to this embodiment, the select gate electrode SG is configured as a stacked film of a plurality of select gate conductive films 71 and inter-select gate conductive film insulating films 72. Hence, as described later, the processability of the select gate electrode SG and the electrode film 61 is improved. Thus, the productivity can be improved.

For instance, the select gate electrode SG is designed to have a relatively large thickness in the Z-axis direction in order to cut off the semiconductor pillar SP in the operation of selecting the semiconductor pillar SP. On the other hand, the electrode film 61 serving as a memory cell MC is designed to have a relatively small thickness along the Z-axis direction in order to integrate the memory cells MC with high density.

That is, the thickness of the select gate electrode SG (first select gate electrode SG1) along the Z-axis direction is larger than the thickness of one electrode film 61 (the thickness of one of the plurality of first electrode films 61a along the Z-axis direction).

In the case where the select gate electrode SG with a large thickness in the Z-axis direction is formed as a single body of conductive film, the condition for patterning the select gate electrode SG is significantly different from the condition for patterning the electrode film 61. Hence, processing these components under appropriate conditions involves switching of processing conditions and additional process steps, which may decrease the productivity.

In contrast, in this embodiment, the select gate electrode SG is configured as a stacked film of conductive films and insulating films. Hence, the condition for patterning the select gate electrode SG can be made similar to the condition for patterning the electrode film 61. Thus, similar processing conditions can be used in processing both of these components. Furthermore, the occurrence of additional process steps is suppressed, and the productivity is improved.

For instance, each of the plurality of select gate conductive films 71 can be made of substantially the same material as each of the plurality of electrode films 61. Furthermore, each of the plurality of select gate conductive films 71 can have substantially the same thickness along the Z-axis direction as each of the plurality of electrode films 61.

The inter-select gate conductive film insulating film 72 can be made of substantially the same material as the interelectrode insulating film 62. Furthermore, the inter-select gate conductive film insulating film 72 can have substantially the same thickness along the Z-axis direction as the interelectrode insulating film 62.

For instance, the select gate conductive film 71 can be a conductive film made of the same material and having the same thickness as the conductive film used for the electrode film 61. The inter-select gate conductive film insulating film 72 can be an insulating film made of the same material and having the same thickness as the insulating film used for the interelectrode insulating film 62. Hence, the select gate electrode SG has the same film composition, and the same processing conditions, as the stacked structure ML. Thus, the productivity is further improved.

However, the embodiment is not limited thereto. The material and thickness of the select gate conductive film 71 may be different from those of the electrode film 61. The material and thickness of the inter-select gate conductive film insulating film 72 may be different from those of the interelectrode insulating film 62.

In the following, an example method for manufacturing the nonvolatile semiconductor memory device 110 is described as an example for the case where the material and thickness of the select gate conductive film 71 are substantially the same as those of the electrode film 61, and the material and thickness of the inter-select gate conductive film insulating film 72 are substantially the same as those of the interelectrode insulating film 62.

FIGS. 5A to 5F and 6A to 6C are sequential schematic cross-sectional views illustrating a method for manufacturing the nonvolatile semiconductor memory device according to the first embodiment.

More specifically, these figures each correspond to a partial schematic cross-sectional view obtained by cutting the interconnection connecting unit MU2 along e.g. the X-Z plane. Furthermore, these figures illustrate the process in which the length in the X-axis direction of a plurality of electrode films 61 (electrode films 61B in this example) stacked in the Z-axis direction is varied in a staircase pattern. These figures show the configuration of the portion above the interlayer insulating film 13. The other portions (such as the semiconductor substrate 11, the circuit unit CU, and the interlayer insulating film 13) are not shown.

Figures 5A, 5B:
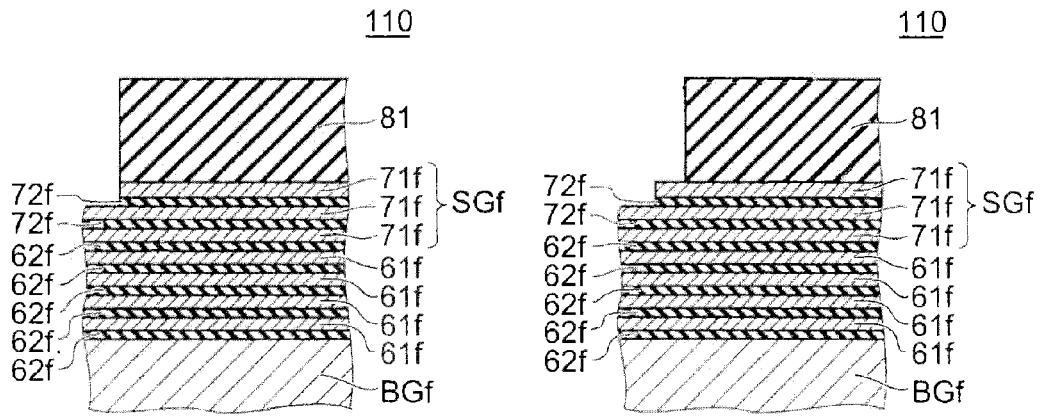
FIGS. 5A to 6C are sequential schematic cross-sectional views illustrating a method for manufacturing the nonvolatile semiconductor memory device according to the first embodiment.

As shown in FIG. 5A, a back gate conductive film BGf serving as a back gate BG is provided on a semiconductor substrate 11 (not shown). On the back gate conductive film BGf, conductive films 61f serving as electrode films 61 are stacked alternately with insulating films 62f serving as interelectrode insulating films 62. In this example, four conductive films 61f are depicted. However, the number of conductive films 61f is arbitrary.

Further thereon, conductive films 71f serving as select gate conductive films 71 are stacked alternately with insulating films 72f serving as inter-select gate conductive film insulating films 72. In this example, three conductive films 71f are depicted. However, the number of conductive films 71f is arbitrary. The plurality of conductive films 71f and the plurality of insulating films 72 thus stacked are included in a select gate electrode film SGf serving as a select gate electrode SG.

In this example, the uppermost layer of the select gate electrode SG (select gate electrode film SGf) is a select gate conductive film 71 (conductive film 71f). However, the uppermost layer of the select gate electrode SG may be an inter-select gate conductive film insulating film 72 (insulating film 72f). In the following description, it is assumed that the uppermost layer of the select gate electrode SG is a select gate conductive film 71 (conductive film 71f).

The conductive film 61f and the conductive film 71f are illustratively made of polysilicon doped with impurity. The conductive film 61f and the conductive film 71f have a thickness of e.g. approximately 50 nanometers (nm). The insulating film 62f and the insulating film 72f are illustratively made of silicon oxide. The insulating film 62f and the insulating film 72f have a thickness of e.g. approximately 30 nm.

Further thereon, a mask material 81 is formed in a prescribed pattern configuration. The mask material 81 is illustratively made of photoresist. The pattern configuration of the mask material 81 can be processed by photolithography.

As shown in FIG. 5A, the mask material 81 is used as a mask to etch the conductive film 71f in the first layer from the top and the insulating film 72f in the first layer from the top. This and subsequent etching processes can be performed by dry etching such as RIE (reactive ion etching).

Then, as shown in FIG. 5B, by slimming the mask material 81, the end of the mask material 81 is set back along e.g. the X-axis direction. Thus, the upper surface of the conductive film 71f in the first layer is partly exposed.

Figures 5C, 5D:
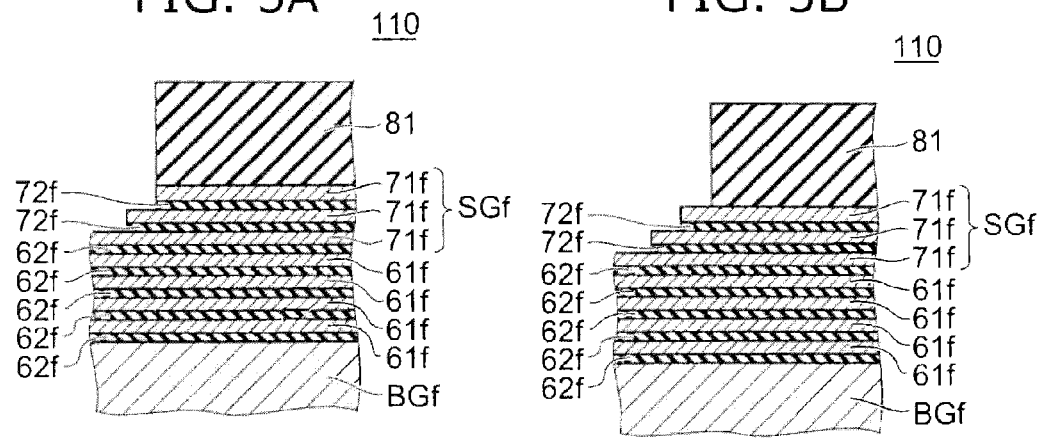

Then, as shown in FIG. 5C, the slimmed mask material 81 is used as a mask to etch the conductive film 71f and the insulating film 72f in the first layer from the top, and etch the conductive film 71f and the insulating film 72f in the second highest layer. Thus, a step difference is formed between the conductive films 71f in the first and second layer.

Then, as shown in FIG. 5D, the mask material 81 is further slimmed.

Figures 5E, 5F:
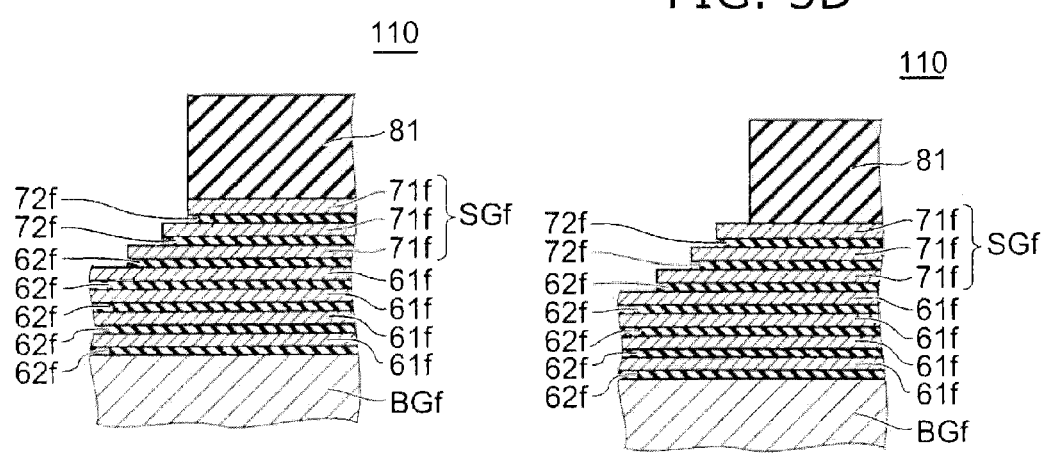

Furthermore, as shown in FIG. 5E, the further slimmed mask material 81 is used as a mask to etch the conductive film 71f and the insulating film 72f in the first layer from the top, and etch the conductive films 71f in the second and third highest layer, and the insulating film 72f in the second highest layer.

Then, as shown in FIG. 5F, the mask material 81 is further slimmed.

Figures 6A, 6B:
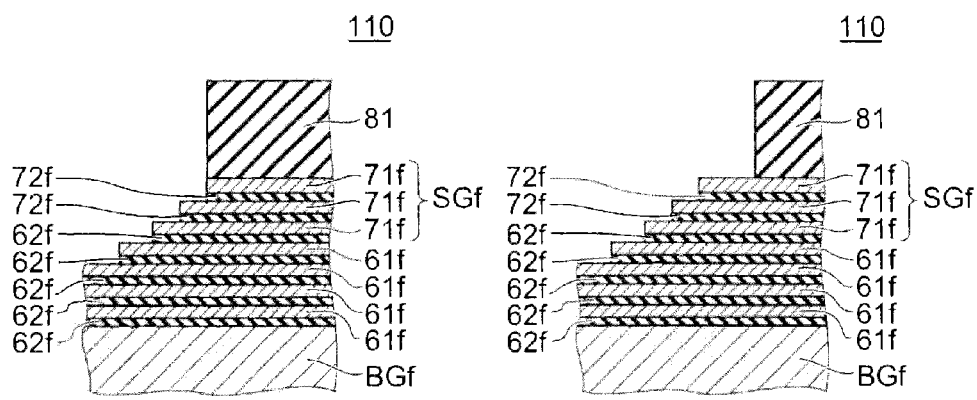

Furthermore, as shown in FIG. 6A, the further slimmed mask material 81 is used as a mask to etch the conductive film 71f and the insulating film 72f in the first layer from the top, and etch the conductive films 71f in the second and third highest layer, the insulating film 72f in the second highest layer, and the conductive film 61f and the insulating film 62f in the first layer from the top.

Then, as shown in FIG. 6B, the mask material 81 is further slimmed.

Thus, etching, and slimming of the mask material 81 are repeated a required number of times to form a prescribed number of step differences in the plurality of conductive films 61f.

Figure 6C:
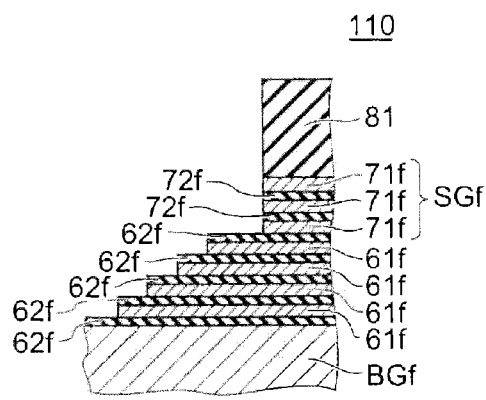

Then, as shown in FIG. 6C, the slimmed mask material 81 is used as a mask to collectively etch the conductive films 71f in the first to third layer and the insulating films 72f in the first and second layer, and further etch the conductive films 61f and the insulating films 62f in the first to fourth layer. Thus, the conductive films 71f in the first to third layer are processed in a shape reflecting the last shape of the mask material 81. The conductive films 61f in the first to fourth layer are processed in a staircase configuration. Thus, a select gate electrode SG including the conductive films 71f in the first to third layer, and a stacked structure ML including the conductive films 61f in the first to fourth layer can be formed.

Thus, in the nonvolatile semiconductor memory device 110 according to this embodiment, a mask material 81 obtained by a single PEP process is used to repeat etching, and slimming of the mask material 81. Thus, a select gate electrode SG, and a stacked structure ML including electrode films 61 with step differences can be manufactured with high productivity.

Figure 7A:
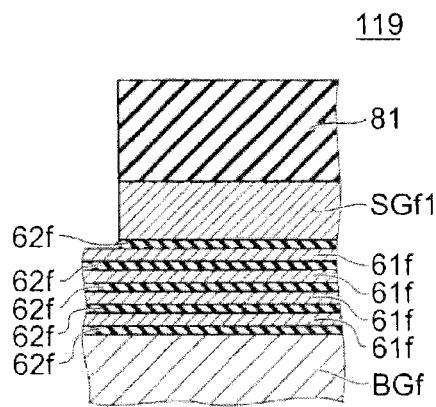
FIGS. 7A to 7C are sequential schematic cross-sectional views illustrating part of a method for manufacturing a nonvolatile semiconductor memory device of a comparative example.
Figure 7B:
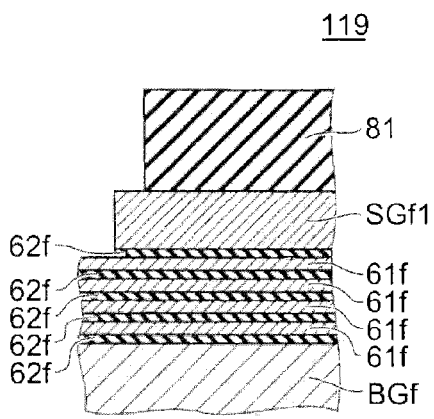
Figure 7C:
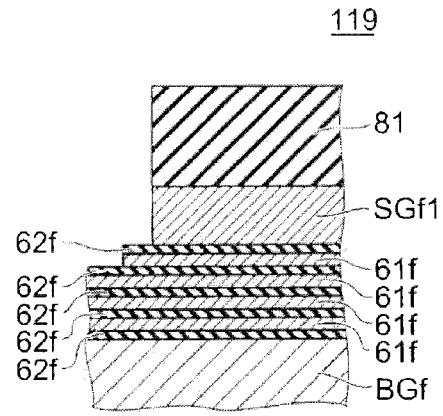

FIGS. 7A to 7C are sequential schematic cross-sectional views illustrating part of a method for manufacturing a nonvolatile semiconductor memory device of a comparative example.

In this comparative example, the select gate electrode SG is not a stacked film, but is a single conductive film thicker than the electrode film 61.

More specifically, as shown in FIG. 7A, in the nonvolatile semiconductor memory device 119 of the comparative example, conductive films 61f and insulating films 62f are alternately stacked, and a single select gate electrode film SGf1 serving as a select gate electrode SG is provided thereon. The select gate electrode film SGf1 serving as the select gate electrode SG has a larger thickness than the conductive film 61f serving as an electrode film 61.

Thus, if the thick select gate electrode film SGf1 is processed using a mask different from the mask for the process of repeating etching and slimming described with reference to FIGS. 5A-5F and 6A-6C, then the number of PEPs increases, and the productivity decreases.

On the other hand, if the thick select gate electrode film SGf1 is processed using the mask for the process of repeating etching and slimming, the processing is as follows.

As shown in FIG. 7A, also in this case, a mask material 81 is formed on the select gate electrode film SGf1. The mask material 81 is used as a mask to process the select gate electrode film SGf1 and the insulating film 62f in the first layer from the top.

Then, as shown in FIG. 7B, the mask material 81 is slimmed.

Then, as shown in FIG. 7C, the slimmed mask material 81 is used as a mask to etch the select gate electrode film SGf1 and the conductive film 61f in the first layer. Here, because the select gate electrode film SGf1 is thick, the condition used to etch the select gate electrode film SGf1 is more severe than the condition for etching the thin conductive film 61f and the thin insulating film 62f. Hence, the etching of the select gate electrode film SGf1 may result in excessive etching of the conductive film 61f and the insulating film 62f. Thus, the conductive film 61f and the insulating film 62f may be removed more than required. In some cases, processing failure may occur.

Furthermore, it takes a long time to etch the thick select gate electrode film SGf1. In the comparative example, the thick select gate electrode film SGf1 needs to be etched for each repetition of etching and slimming described with reference to FIGS. 5A to 5F and 6A to 6C. Thus, the overall processing time is prolonged.

In contrast, in the nonvolatile semiconductor memory device 110 according to this embodiment, the select gate electrode SG (select gate electrode film SGf) is a stacked film of a plurality of select gate conductive films 71 (conductive films 71f) and inter-select gate conductive film insulating films 72 (insulating films 72f) provided therebetween. Thus, the condition for processing the select gate conductive film 71 and the inter-select gate conductive film insulating film 72 can be made close to the condition for processing the electrode film 61 and the interelectrode insulating film 62.

Thus, a mask material 81 obtained by a single PEP process is used to repeat etching, and slimming of the mask material 81. Thus, a select gate electrode SG, and a stacked structure ML including electrode films 61 with step differences can be manufactured with high productivity. By designing each of the plurality of select gate conductive films 71 to have a small thickness, the condition for processing the select gate conductive film 71 is relaxed. This can suppress excessive etching of the conductive film 61f and the insulating film 62f during the processing of the select gate conductive film 71. Thus, removal of the conductive film 61f and the insulating film 62f more than required can be suppressed.

Furthermore, if the select gate conductive film 71 and the inter-select gate conductive film insulating film 72 are designed to have substantially the same configuration (e.g., material and thickness) as the electrode film 61 and the inter-electrode insulating film 62, then the condition for processing the select gate conductive film 71 and the inter-select gate conductive film insulating film 72 can be made the same as the condition for processing the electrode film 61 and the inter-electrode insulating film 62. Thus, the stability of processing is further enhanced, and the productivity can be further improved.

The thickness of the select gate electrode SG along the Z-axis direction can be determined based on the thickness required for controlling the semiconductor pillar SP. Then, the thickness and the number of select gate conductive films 71, and the thickness of the inter-select gate conductive film insulating film 72 can be determined based on the thickness of the select gate electrode SG along the Z-axis direction, and its processability.

The number of electrode films 61 is arbitrarily determined e.g. in accordance with the number of memory cells MC formed in one semiconductor pillar SP.

The number of electrode films 61 in one stacked structure ML is larger than the number of select gate conductive films 71 in one select gate electrode SG.

As described above, the embodiment can include a method for manufacturing a nonvolatile semiconductor memory device. The nonvolatile semiconductor memory device includes: a stacked structure ML including a plurality of electrode films 61 stacked in the Z-axis direction, and an interelectrode insulating film 62 provided between the plurality of electrode films 61; a select gate electrode SG stacked with the stacked structure ML along the Z-axis direction, the select gate electrode SG including a plurality of select gate conductive films 71 stacked in the Z-axis direction and an inter-select gate conductive film insulating film 72 provided between the plurality of select gate conductive films 71; a semiconductor pillar SP piercing the stacked structure ML and the select gate electrode SG in the Z-axis direction; a memory layer 48 provided between the plurality of electrode films 61 and the semiconductor pillar SP; an inner insulating film 42 provided between the memory layer 48 and the semiconductor pillar SP; an outer insulating film 43 provided between the memory layer 48 and the plurality of electrode films 61; and a select gate insulating film SGI provided between the plurality of select gate conductive films 71 and the semiconductor pillar SP.

This manufacturing method can comprise: forming a stacked film preform on a substrate (semiconductor substrate 11), the stacked film preform including a stacked film including a conductive film 61f serving as the electrode film 61 and an insulating film 62f serving as the interelectrode insulating film 62, and a stacked film including a conductive film 71f serving as the select gate conductive film 71 and an insulating film 72f serving as the inter-select gate conductive film insulating film 72; forming a mask material 81 having a predetermined pattern configuration on the stacked film preform; and processing the stacked film preform by repeating etching of the stacked film preform using the mask material 81 as a mask and slimming of the mask material 81.

That is, in this manufacturing method, the repetition of etching and slimming described with reference to FIGS. 5A to 5F and 6A to 6C is performed to process the stacked film preform including the conductive film 61f, the insulating film 62f, the conductive film 71f, and the insulating film 72f.

The step of forming the stacked film preform including the conductive film 61f, the insulating film 62f, the conductive film 71f, and the insulating film 72f can illustratively include forming a stacked film including the conductive film 61f and the insulating film 62f, and forming a stacked film including the conductive film 71f and the insulating film 72f. In this case, for instance, first, the conductive film 61f and the insulating film 62f are alternately stacked. Subsequently, the conductive film 71f and the insulating film 72f are alternately stacked.

Thus, the configuration of the step of forming the stacked film preform including the conductive film 61$f$, the insulating film 62$f$, the conductive film 71$f$, and the insulating film 72$f$ is arbitrary.

In this manufacturing method, the material and thickness of the conductive film 61$f$ can be made substantially the same as the material and thickness of the conductive film 71$f$. Furthermore, the material and thickness of the insulating film 62$f$ can be made substantially the same as the material and thickness of the insulating film 72$f$. Thus, the processing condition can be made uniform, and the productivity can be further improved.

Second Embodiment

Figure 8:
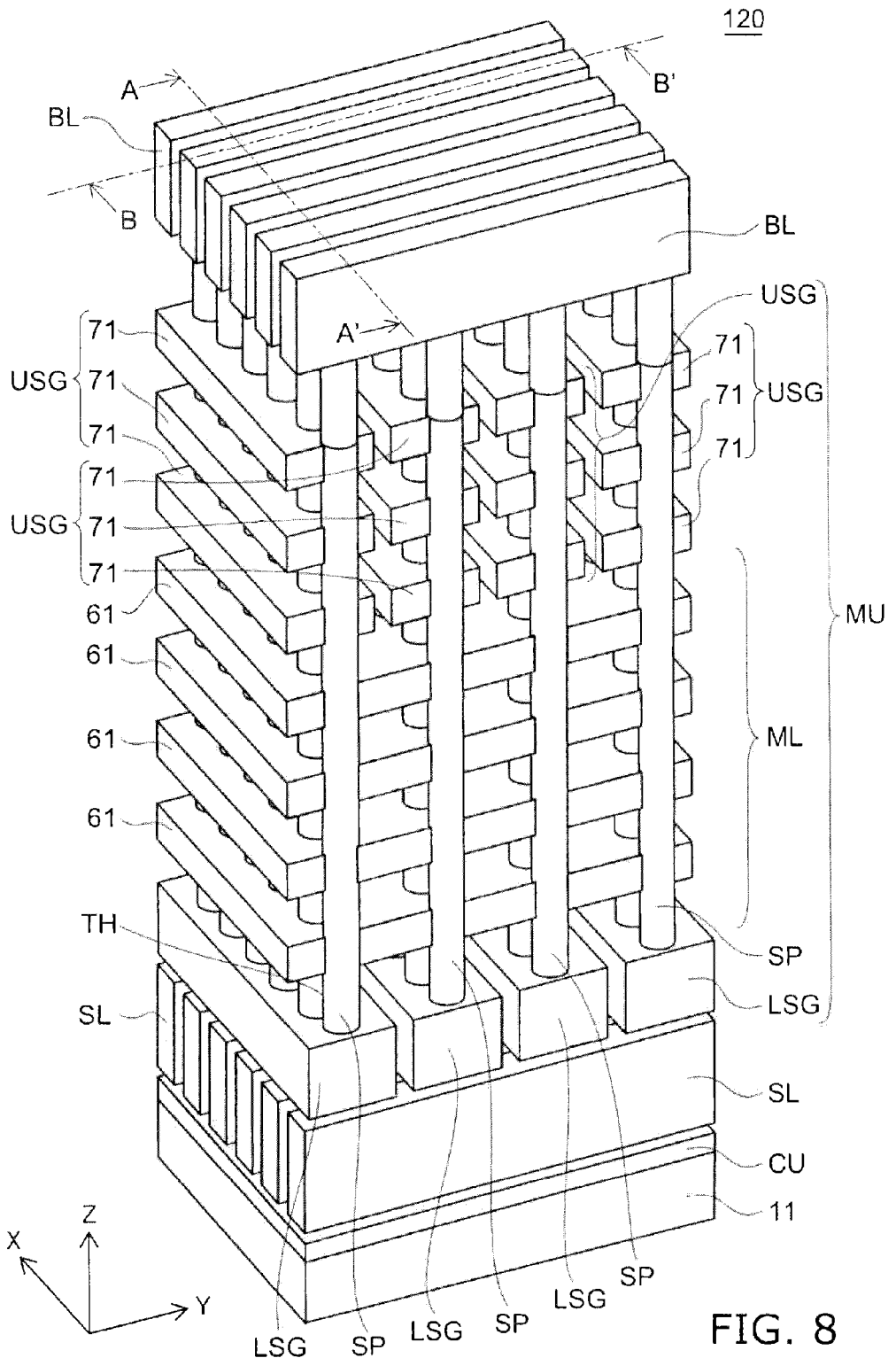
FIG. 8 is a schematic perspective view illustrating the configuration of a nonvolatile semiconductor memory device according to a second embodiment.

FIG. 8 is a schematic perspective view illustrating the configuration of a nonvolatile semiconductor memory device according to a second embodiment.

Figure 9:
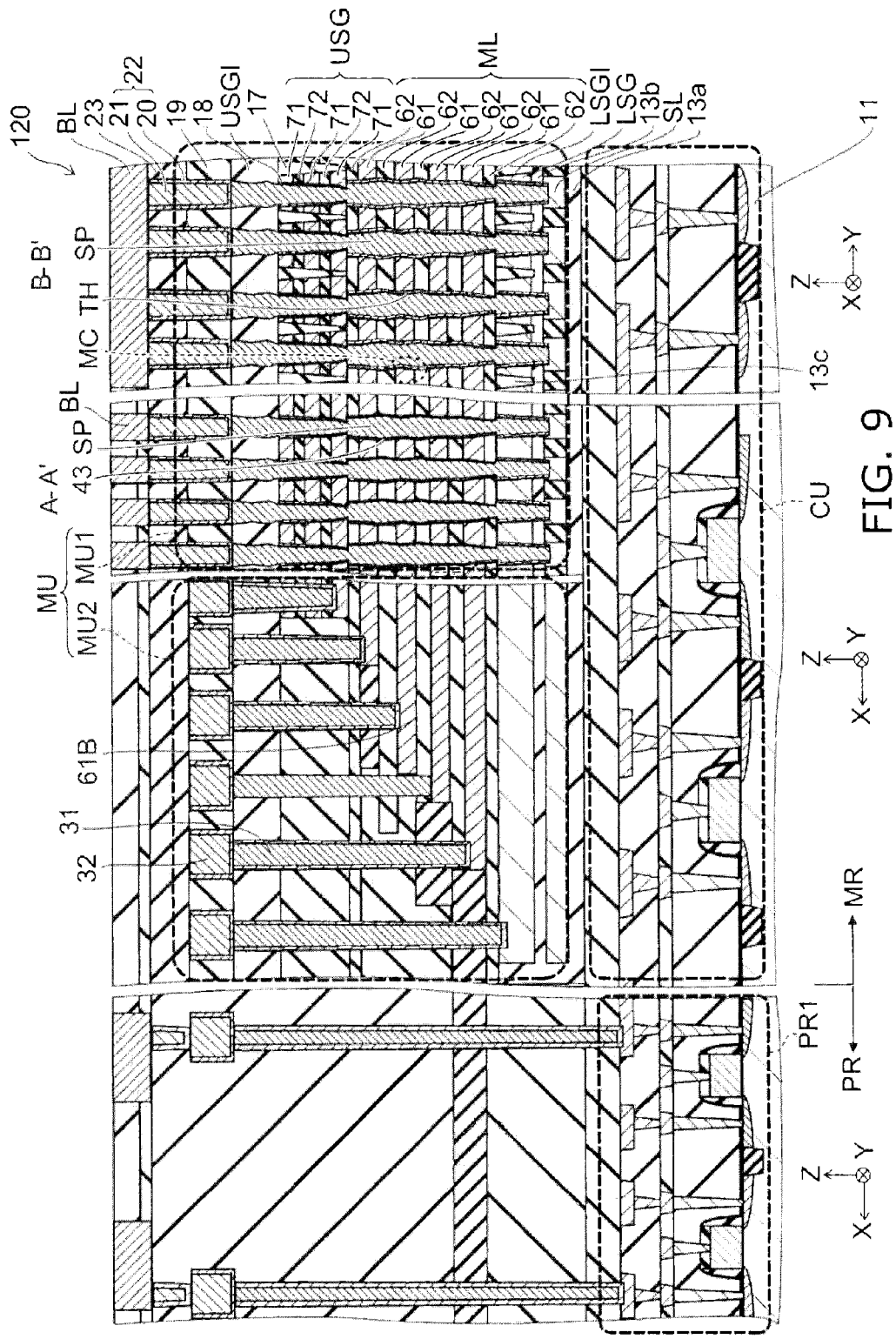
FIG. 9 is a schematic cross-sectional view illustrating the configuration of the nonvolatile semiconductor memory device according to the second embodiment.

FIG. 9 is a schematic cross-sectional view illustrating the configuration of the nonvolatile semiconductor memory device according to the second embodiment.

In FIG. 8, for clarity of illustration, only the conductive portions are shown, and illustration of the insulating portions is omitted.

As shown in FIGS. 8 and 9, in the nonvolatile semiconductor memory device 120 according to this embodiment, the semiconductor pillars SP are not connected in a U-shape, but are independent of each other. That is, the nonvolatile semiconductor memory device 120 includes linear NAND strings. An upper select gate electrode USG is provided above the stacked structure ML. A lower select gate electrode LSG is provided below the stacked structure ML.

The upper select gate electrode USG and the lower select gate electrode LSG are included in a select gate electrode SG. The upper select gate electrode USG is stacked with the stacked structure ML along the Z-axis direction. The lower select gate electrode LSG is also stacked with the stacked structure ML along the Z-axis direction.

A source line SL is provided below the lower select gate electrode LSG. An interlayer insulating film 13$a$ is provided below the source line SL. An interlayer insulating film 13$b$ is provided between the source line SL and the lower select gate electrode LSG.

The semiconductor pillar SP is connected to the source line SL below the lower select gate electrode LSG, and to a bit line BL above the upper select gate electrode USG. Thus, memory cells MC are formed in the stacked structure ML between the upper select gate electrode USG and the lower select gate electrode LSG, and the semiconductor pillar SP functions as one linear NAND string.

The upper select gate electrode USG and the lower select gate electrode LSG are divided by an interlayer insulating film 17 and an interlayer insulating film 13$c$, respectively, and shaped like strips extending along the X-axis direction.

On the other hand, the bit line BL connected to the upper portion of the semiconductor pillar SP and the source line SL connected to the lower portion of the semiconductor pillar SP are shaped like strips extending in the Y-axis direction.

In this case, the electrode film 61 is a plate-like conductive film parallel to the X-Y plane.

In this example, the upper select gate electrode USG includes a plurality of select gate conductive films 71 stacked in the Z-axis direction, and an inter-select gate conductive film insulating film 72 provided between the plurality of select gate conductive films 71. In this example, three select gate conductive films 71 are provided. However, the number of select gate conductive films 71 is arbitrary.

A select gate insulating film (upper select gate insulating film USGI) is provided between the plurality of select gate conductive films 71 of the upper select gate electrode USG and the semiconductor pillar SP.

A lower select gate insulating film LSGI is provided between the lower select gate electrode LSG and the semiconductor pillar SP. The upper select gate insulating film USGI and the lower select gate insulating film LSGI are illustratively made of silicon oxide.

Thus, also in the nonvolatile semiconductor memory device 120 according to this embodiment, the select gate electrode SG (upper select gate electrode USG) is configured as a stacked film of a plurality of select gate conductive films 71 and inter-select gate conductive film insulating films 72. Hence, the processability of the select gate electrode SG and the electrode film 61 is improved. Thus, the productivity can be improved.

Thus, also in the nonvolatile semiconductor memory device 120, by the process of repeating etching and slimming described with reference to FIGS. 5A to 5F and 6A to 6C, a select gate electrode SG (upper select gate electrode USG), and a stacked structure ML including electrode films 61 with step differences can be manufactured with high productivity.

In this example, the upper select gate electrode USG has the structure of a stacked film of select gate conductive films 71 and inter-select gate conductive film insulating films 72.

However, the structure of a stacked film of select gate conductive films 71 and inter-select gate conductive film insulating films 72 may be applied to at least one of the upper select gate electrode USG and the lower select gate electrode LSG.

As described above, the present embodiments provide a nonvolatile semiconductor memory device having the configuration of the collectively processed three-dimensional stacked memory with improved productivity.

In the foregoing description, the memory layer 48 is illustratively made of silicon nitride. However, the embodiments are not limited thereto. The memory layer 48 can be a single layer film made of a material selected from the group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a stacked film made of a plurality of materials selected from the group.

Furthermore, the interelectrode insulating film 62, the inner insulating film 42, the outer insulating film 43, and the inter-select gate conductive film insulating film 72 can be a single layer film made of a material selected from the group consisting of silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a stacked film made of a plurality of materials selected from the group.

In this specification, "perpendicular" and "parallel" mean not only being exactly perpendicular and exactly parallel, but include, for instance, variations in the manufacturing process, and only need to mean substantially perpendicular and substantially parallel.

The embodiments of the invention have been described with reference to examples. However, the invention is not limited to these examples. For instance, various specific configurations of the components such as the electrode film, interelectrode insulating film, select gate electrode, select gate conductive film, inter-select gate conductive film insulating film, semiconductor pillar, memory layer, charge storage layer, inner insulating film, outer insulating film, insulating film, conductive film, interlayer insulating film, source line, bit line, and interconnection included in the nonvolatile semiconductor memory device are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible. Such combinations are also encompassed within the scope of the invention as long as they fall within the spirit of the invention.

Furthermore, those skilled in the art can suitably modify and implement the nonvolatile semiconductor memory device and the method for manufacturing the same described above in the embodiments of the invention. All the nonvolatile semiconductor memory devices and the methods for manufacturing the same thus modified are also encompassed within the scope of the invention as long as they fall within the spirit of the invention.

Furthermore, those skilled in the art can conceive various modifications and variations within the spirit of the invention. It is understood that such modifications and variations are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A nonvolatile semiconductor memory device comprising:
    a first stacked structure including a plurality of first electrode films stacked in a first direction and a first interelectrode insulating film provided between the plurality of first electrode films;
    a first select gate electrode stacked with the first stacked structure along the first direction, the first select gate electrode including a plurality of first select gate conductive films stacked in the first direction and a first inter-select gate conductive film insulating film provided between the plurality of first select gate conductive films;
    a first semiconductor pillar piercing the first stacked structure, the plurality of first select gate conductive films and the first inter-select gate conductive film insulating film in the first direction;
    a first memory portion provided between each of the plurality of first electrode films and the first semiconductor pillar;
    a first inner insulating film provided between the first memory portion and the first semiconductor pillar;
    a first outer insulating film provided between the first memory portion and the plurality of first electrode films; and
    a first select gate insulating film provided between each of the plurality of first select gate conductive films and the first semiconductor pillar,
    wherein ends of at least two of the plurality of first electrode films form a step.

2. The device according to claim 1, wherein each of the plurality of first select gate conductive films is made of a material the same as a material of each of the plurality of first electrode films.

3. The device according to claim 1, wherein each of the plurality of first select gate conductive films has a thickness the same as a thickness of each of the plurality of first electrode films.

4. The device according to claim 1, further comprising:
    a second stacked structure being adjacent to the first stacked structure in a second direction perpendicular to the first direction, the second stacked structure including a plurality of second electrode films stacked in the first direction and a second interelectrode insulating film provided between the plurality of second electrode films;
    a second select gate electrode stacked with the second stacked structure along the first direction, the second select gate electrode including a plurality of second select gate conductive films stacked in the first direction and a second inter-select gate conductive film insulating film provided between the plurality of second select gate conductive films;
    a second semiconductor pillar piercing the second stacked structure and the second select gate electrode in the first direction;
    a second memory portion provided between each of the plurality of second electrode films and the second semiconductor pillar;
    a second inner insulating film provided between the second memory portion and the second semiconductor pillar;
    a second outer insulating film provided between the second memory portion and the plurality of second electrode films;
    a second select gate insulating film provided between the plurality of second select gate conductive films and the second semiconductor pillar; and
    a semiconductor connecting portion connecting one end of the first semiconductor pillar and one end of the second semiconductor pillar.

5. The device according to claim 4, further comprising:
    a first interconnection connected to another end of the first semiconductor pillar on opposite side from the semiconductor connecting portion; and
    a second interconnection connected to another end of the second semiconductor pillar on opposite side from the semiconductor connecting portion and extending in a direction orthogonal to an extending direction of the first interconnection.

6. The device according to claim 4, wherein
    each of the plurality of second select gate conductive films has a thickness the same as a thickness of each of the plurality of first select gate conductive films, and
    each of the plurality of second inter-select gate conductive film insulating films has a thickness the same as a thickness of each of the plurality of first inter-select gate conductive film insulating films.

7. The device according to claim 1, wherein the first inter-select gate conductive film insulating film is made of a material the same as a material of the first interelectrode insulating film.

8. The device according to claim 1, wherein the first inter-select gate conductive film insulating film has a thickness the same as a thickness of the first interelectrode insulating film.

9. The device according to claim 1, wherein the first select gate electrode has a thickness along the first direction larger than a thickness along the first direction of one of the plurality of first electrode films.

10. The device according to claim 1, wherein a number of the plurality of first electrode films is larger than a number of the plurality of first select gate conductive films.

11. The device according to claim 1, wherein the first electrode film includes at least one of polycrystalline silicon doped with an impurity and amorphous silicon doped with an impurity.

12. The device according to claim 1, wherein the first select gate conductive film includes at least one of amorphous silicon doped with an impurity and polycrystalline silicon doped with an impurity.

13. The device according to claim 1, further comprising a contact member electrically connecting the plurality of first select gate conductive films.

14. The device according to claim 13, wherein the contact member extends in the first direction.

15. The device according to claim 13, wherein the contact member electrically connects the plurality of first select gate conductive films at each end portion of the plurality of first select gate conductive films.

16. The device according to claim 13, wherein the contact member pierces at least one of the plurality of first select gate conductive films in the first direction.

17. The device according to claim 1, wherein each end of the plurality of first select gate conductive films is disposed in a plane parallel to the first direction.

18. The device according to claim 13, wherein
the plurality of first select gate conductive films includes a nearest select gate conductive film and other select gate conductive films except for the nearest select gate conductive films, the nearest select gate conductive film being nearest to the first stacked structure among the plurality of first select gate conductive films,
the contact member has an end on a side of the first stacked structure,
the nearest select gate conductive film contacts the end of the contact member, and
other select gate conductive films contact a side face of the contact member.

19. The device according to claim 1, wherein the plurality of first select gate conductive films are configured capable to be set at a same potential.

20. The device according to claim 1, wherein a thickness of each of plurality of first electrode films is larger than a thickness of the first inter-select gate conductive film insulating film.

21. The device according to claim 1, wherein a thickness of each of plurality of first electrode films is larger than a thickness of the first interelectrode insulating film.

22. The device according to claim 1, wherein a thickness of each of the plurality of first select gate conductive films is larger than a thickness of the first inter-select gate conductive film insulating film.

23. The device according to claim 1, wherein a thickness of each of the plurality of first select gate conductive films is larger than a thickness of the first interelectrode insulating film.

* * * * *